(12) United States Patent
Tokura et al.

(10) Patent No.: US 7,715,094 B2
(45) Date of Patent: May 11, 2010

(54) OPTICAL FIBER ELEMENT AND METHOD FOR IMPARTING NON-RECIPROCITY OF LIGHT USING THE SAME

(75) Inventors: Yoshinori Tokura, Tsukuba (JP); Yoshiaki Shimada, Itabashi-ku (JP); Yoshio Kaneko, Chiba (JP)

(73) Assignees: Japan Science of Technology Agency, Kawaguchi-shi (JP); National Institute of Advanced Industrial Science and Technology, Tokyo (JP)

( * ) Notice: Subject to any disclaimer, the term of this patent is extended or adjusted under 35 U.S.C. 154(b) by 155 days.

(21) Appl. No.: 11/909,340

(22) PCT Filed: May 9, 2006

(86) PCT No.: PCT/JP2006/309304

§ 371 (c)(1), (2), (4) Date: Sep. 21, 2007

(87) PCT Pub. No.: WO2006/129453

PCT Pub. Date: Dec. 7, 2006

(65) Prior Publication Data
US 2009/0034060 A1 Feb. 5, 2009

(30) Foreign Application Priority Data
May 30, 2005 (JP) ............................ 2005-156557

(51) Int. Cl.
H04B 10/17 (2006.01)
G02F 1/05 (2006.01)
C03C 13/02 (2006.01)
H04B 10/12 (2006.01)

(52) U.S. Cl. .................. 359/341.5; 385/141; 385/142; 385/144; 501/23; 501/38

(58) Field of Classification Search ............. 359/341.5; 385/141, 142, 144; 402/23, 38
See application file for complete search history.

(56) References Cited

U.S. PATENT DOCUMENTS

| 4,921,328 A | * | 5/1990 | Seth | ............................ | 385/2 |
| 5,663,556 A | * | 9/1997 | Wessels et al. | ............ | 250/214.1 |
| 6,122,429 A | * | 9/2000 | Wessels et al. | .............. | 385/130 |
| 6,303,393 B1 | * | 10/2001 | Wessels et al. | ................. | 438/3 |

FOREIGN PATENT DOCUMENTS

| EP | 470523 A2 * | 2/1992 |
| JP | 6-242402 | 9/1994 |
| JP | 7-64023 | 3/1995 |
| JP | 7-104227 | 4/1995 |

(Continued)

Primary Examiner—Eric Bolda
(74) Attorney, Agent, or Firm—Oblon, Spivak, McClelland, Maier & Neustadt, L.L.P.

(57) ABSTRACT

The present invention provides a rare earth element-doped optical fiber amplifier having a function which allows to omit an optical isolator component, and a method for providing the optical non-reciprocity using the same. In the optical fiber, the optical fiber matrix material is a ferroelectric solid state material, and the ferroelectric solid state material is doped by a rare earth element such as erbium (Er) or thulium (Tm). The optical fiber is characterized by an optical amplification function and an optical non-reciprocity function.

9 Claims, 5 Drawing Sheets

FOREIGN PATENT DOCUMENTS

| | | | |
|---|---|---|---|
| JP | 07089762 A | * | 4/1995 |
| JP | 407089762 A | * | 4/1995 |
| JP | 11-23849 | | 1/1999 |
| JP | 2003-510650 | | 3/2003 |
| JP | 2004204305 A | * | 7/2004 |
| JP | 2006335621 A | * | 12/2006 |

* cited by examiner

OPTICAL FIBER ELEMENT AND METHOD FOR IMPARTING NON-RECIPROCITY OF LIGHT USING THE SAME

TECHNICAL FIELD

The present invention relates to an optical fiber amplifier (device) and a method for providing an optical non-reciprocity using the optical fiber amplifier in the optical fiber technology which is a central technology in the optical communication. The optical fiber amplifier referred hereto indicates a functional component using a solid state material as an optical fiber for optical propagation. The function herein means not only a passive function merely to propagate a light but also active functions such as optical modulation function, optical amplification function, optical nonlinearity function, lasing function, optical switching function, and optical detection function.

BACKGROUND ART

In recent years, the optical communication technology has established its steady state as a high capacity, high speed signal transmission means by realizing an optical fiber as a medium for optical transmission with an ultra low propagation loss reaching the theoretical limit of 0.2 dB/km. The area of communication is not limited to be at-home and domestic but extends overseas, and is expanding rapidly as an information transmission means in a global network. Now it is a matter of time before it replaces the communication means by electric wires.

Development of low loss fiber material has played a crucial role in progress in the optical communication technology, but a further important progress is a progress in optical fiber amplifier. Although there are many functions of amplifiers, an optical amplification function is one of the most important technologies to fabricate optical networks. The optical amplification technology enables compensating the optical loss due to the optical fiber (Refer to Patent Documents 1 and 2 and non-Patent Documents 1 and 2 below). By placing fibers having the optical amplification function at relay stations arranged at an appropriate distance inbetween, information signal can be transmitted with no distance limitation in principle, at a speed of light and without need to convert optical signal to electrical signal. As a result, optical devices with high functionality and various optical systems can be realized. At present, the network of the optical fiber communication system reaches as long as not less than 10,000 km, and a feasible information amount per unit time is as high as 40 Gbit/s. By a progress in wavelength multiplexing technology, a transmission system with multiplexing of 256 wavelengths multiplexing is made possible, and consequently the transmission capacity of data through a single optical fiber extends to exceed 10 Tbit/s.

Furthermore, an optical fiber amplifier can be operated as a laser. The optical fiber laser has already expanded to many aspects such as a single wavelength laser, a multiple wavelength laser, a short pulse laser, and a high power laser. From a laser doped with rare earth element, as much output power as needed is available in principle if it is excited strongly. Such a high output power laser is useful as an excitation light source for other optical amplifier and an optical nonlinear device, and receives much attention as an alternative of the high power solid state laser now under use in industry. An Yb-doped optical fiber laser with continuous wave output power exceeding 1 kW has already been reported (See non-Patent document 3 below.).

[Patent Document 1] Japanese Patent Application Publication No. 2001-77451

[Patent Document 2] Japanese Patent Application Publication No. 2003-523457

[Non-Patent Document 1] M. Nakazawa et al., Appl. Phys. Lett., vol. 54, 295 (1987)

[Non-Patent Document 2] "Erbium Doped Optical Fiber Amplifier" Ed. by Sudo, Optronics Co. (1999)

[Non-Patent Document 3] Y. Jeong et al., Electron. Lett., vol. 40, 470 (2004)

[Non-Patent Document 4] K. Onodera et al., Tokin Tech. Rev., vol. 21, 33-36 (1994)

DISCLOSURE OF INVENTION

The present invention adds a function of an optical isolator component which is one of constituent components in various functional optical fiber amplifiers to a function of a rare earth element-doped optical fiber amplifier which is another constituent component, thereby making unnecessary the optical isolator component which required typically in pair.

Among various functions in various optical fiber amplifiers, an optical amplification function is the most important function for the optical communication technology. A basic structure of a conventional optical amplification component (device) or an optical amplifier is shown in FIG. 1.

As shown in FIG. 1, an optical amplifier comprises an optical isolator 101, a semiconductor laser for excitation 102, a wavelength division multiplexing coupler 103, and a rare earth element-doped fiber 104. The optical isolator 101 is used for cutting down a light traveling in the direction opposite to the light propagation direction. The light traveling in the opposite direction is generated strongly due to the amplified spontaneous emission (ASE), and it is important to attenuate the light traveling in the opposite direction in order to increase in gain of the optical amplification. The light traveling in the opposite direction is also generated due to the Fresnel reflection at connection points between optical fibers and other devices. Therefore, the optical isolator 101 is disposed also on the exit side of the rare earth element doped optical fiber 104. The optical isolator also plays a role for preventing an occurrence of parasitic oscillation of a laser due to the light traveling in the opposite direction.

The optical isolator 101 is thus a non-reciprocal component having a property to pass a light only in one direction, and can be realized by using magneto-optical material having optical non-reciprocity such as the Faraday effect.

FIG. 2 shows an operational principle of the optical isolator in prior art. The optical isolator comprises a polarizer 202 which passes only a light linearly polarized in one direction, an analyzer 204, and a Faraday rotator 203 which has a rotation angle of 45 degrees. The polarizer 202 and the analyzer 204 are arranged so as to make an angle of 45 degrees with each other. A light 201 incident from the left to the right passes through the polarizer 202 and becomes a linearly polarized light. This linearly polarized light rotates by 45 degrees in clockwise when it passes through the Faraday rotator 203. Since the analyzer 204 is arranged with its principal axis angled by 45 degrees, the linearly polarized light which has passed through the Faraday rotator 203 passes the analyzer 204 and becomes an outgoing light 206 (Refer to FIG. 2 (a)). In FIG. 2, reference numeral 205 indicates a direction of a magnetic field.

On the other hand, a light 211 incident from right side becomes a linearly polarized light angled by 45 degrees when it passes the analyzer 204, and enter the Faraday rotator 203.

The light then rotates by 45 degrees in anti-clockwise direction due to the non-reciprocity of the Faraday rotator, and exits the Faraday rotator 203 as a linearly polarized light with the polarization direction parallel to the horizontal direction. As a result, the linearly polarized light which has passed through the Faraday rotator 203 in the opposite direction can not pass through the polarizer 202 which passes only the vertically polarized light (Refer to FIG. 2 (b)).

FIG. 3 shows an example of an optical isolator used in an optical amplifier under practical usage (Refer to the Non-Patent Document 2 described above).

In this figure, reference numeral 301 indicates an input fiber, 302 and 307 indicate lenses, 303 and 306 indicate birefringent crystals (wedges), 304 and 305 indicate Faraday rotators (rotation by 45 degrees), and 308 indicates an output fiber.

Here, the optical isolator comprises two lenses 302 and 307, two birefringent crystals 303 and 306, and two Faraday components with rotation by 45 degrees 304 and 305. It is understood that many constituent components are required and an external magnetic field is necessary. Furthermore, the optical isolator has to be transmissive at a wavelength for optical amplification as well as at a wavelength for excitation of the rare earth element used in the rare earth element-doped fiber. When Erbium (Er) is used as a rare earth element and a semiconductor laser with wavelength of 0.98 μm is used as an excitation source, a material to be selected for a Faraday component has to be transmissive at wavelengths of 0.98 μm and 1.55 μm. For this reason, YIG (Yttrium Iron Garnet) crystal is generally used as a Faraday component material. However, because absorption due to Fe lies near 1 μm, YIG can be used only in wavelength longer than 1.1 μm. Then, for an optical isolator transmissive at 1 μm region, a material such as CdMnHgTe is now under development. (Refer to the Non-Patent Document 4 described above).

By taking the situation described above into account, an object of the present invention is to provide a rare earth element-doped optical fiber amplifier having a function which allows to omit an optical isolator component for the purpose of simplification of the constituent components and to provide a method for providing optical non-reciprocity using the optical fiber amplifier.

The present inventors realized not only an optical amplification function but also an optical isolator function providing a non-reciprocal optical effect which is necessary in a constituent component of an optical amplifier, by utilizing a ferroelectric solid state material as an optical fiber matrix material and by doping a rare earth element into the ferroelectric solid state material. In the optical fiber amplifier, the rare earth element is Erbium (Er) or Thulium (Tm). In addition, Ytterbium (Yb) may be further doped as a photo-sensitizing rare earth-element. Moreover, the rare earth element-doped optical fiber amplifier may be a Perovskite-type oxide optical fiber amplifier wherein the ferroelectric solid state material as a matrix material of the optical fiber is a titanium oxide compound $AE_{1-x}AE'_xTiO_3$ where AE and AE' are an alkaline earth-element such as Ca, Sr, and Ba, and $0 \leq x \leq 1$. Also the optical fiber amplifier doped by a rare earth-element such as Erbium (Er) may be an optical fiber amplifier wherein the optical fiber matrix material is a ferroelectric solid state material $Pb(Zr,Ti)O_3$. Also the optical fiber amplifier may be an optical fiber amplifier wherein the optical fiber matrix material is a ferroelectric solid state material $(Pb,La)(Zr,Ti)O_3$. The optical fiber amplifier as described above may be an optical fiber amplifier wherein a polarization is generated by applying an electric field at an angle close to perpendicular to the light propagation direction to the ferroelectric solid state material from which the amplifier is constituted, and wherein the luminescence efficiency is made different between the light propagation direction and the opposite direction thereto by applying a magnetic field at an angle close to perpendicular both to the light propagation direction and the polarization direction. Furthermore, an optical non-reciprocity is provided by using a method using the optical fiber amplifier described above, wherein polarization is generated by applying an electric field at an angle close to perpendicular to the light propagation direction to the ferroelectric solid state material from which the optical fiber amplifier is constituted, and wherein the luminescence efficiency is made different between the light propagation direction and the opposite direction thereto by applying a magnetic field in a direction close to perpendicular both to the light propagation direction and the polarization direction.

BEST MODE FOR CARRYING OUT THE INVENTION

In an optical fiber doped by a rare earth element such as an Erbium (Er) element or a Thulium (Tm) element, a matrix material of the optical fiber amplifier is a ferroelectric solid state material, and magnetic field is applied up and down close to perpendicularly to the light propagation direction. The ferroelectric solid state material is in advance polarized in a direction perpendicularly both to the light propagation direction and the magnetic field direction (Refer to FIG. 4). In addition, the ferroelectric solid state material may not be of a linear shape but may be of a curved shape as the conventional optical fiber.

Embodiment

An embodiment according to the present invention is described in the following.

Figure 1:
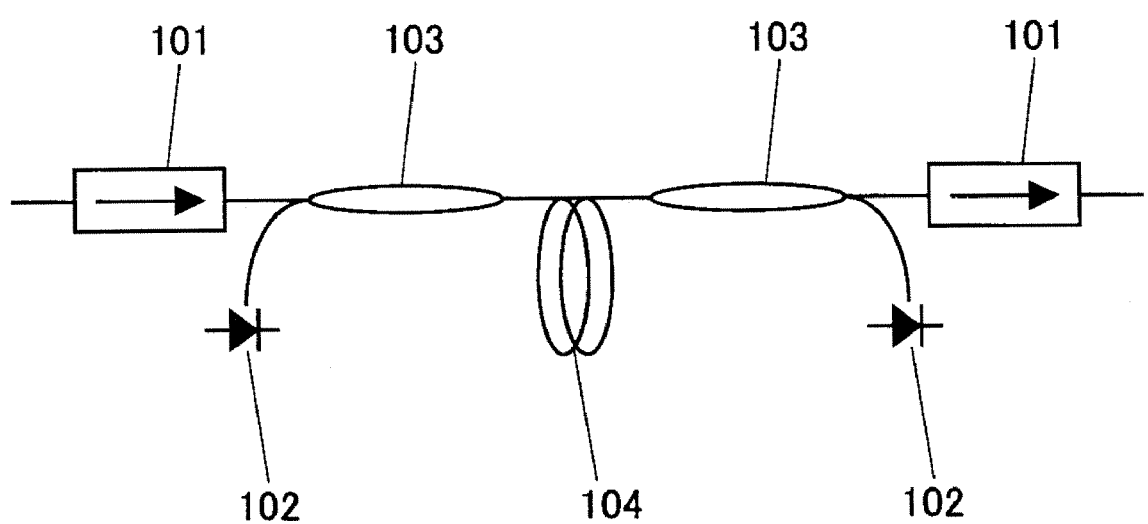
FIG. 1 is a schematic illustration showing the basic configuration of the conventional optical amplifier.
Figure 2:
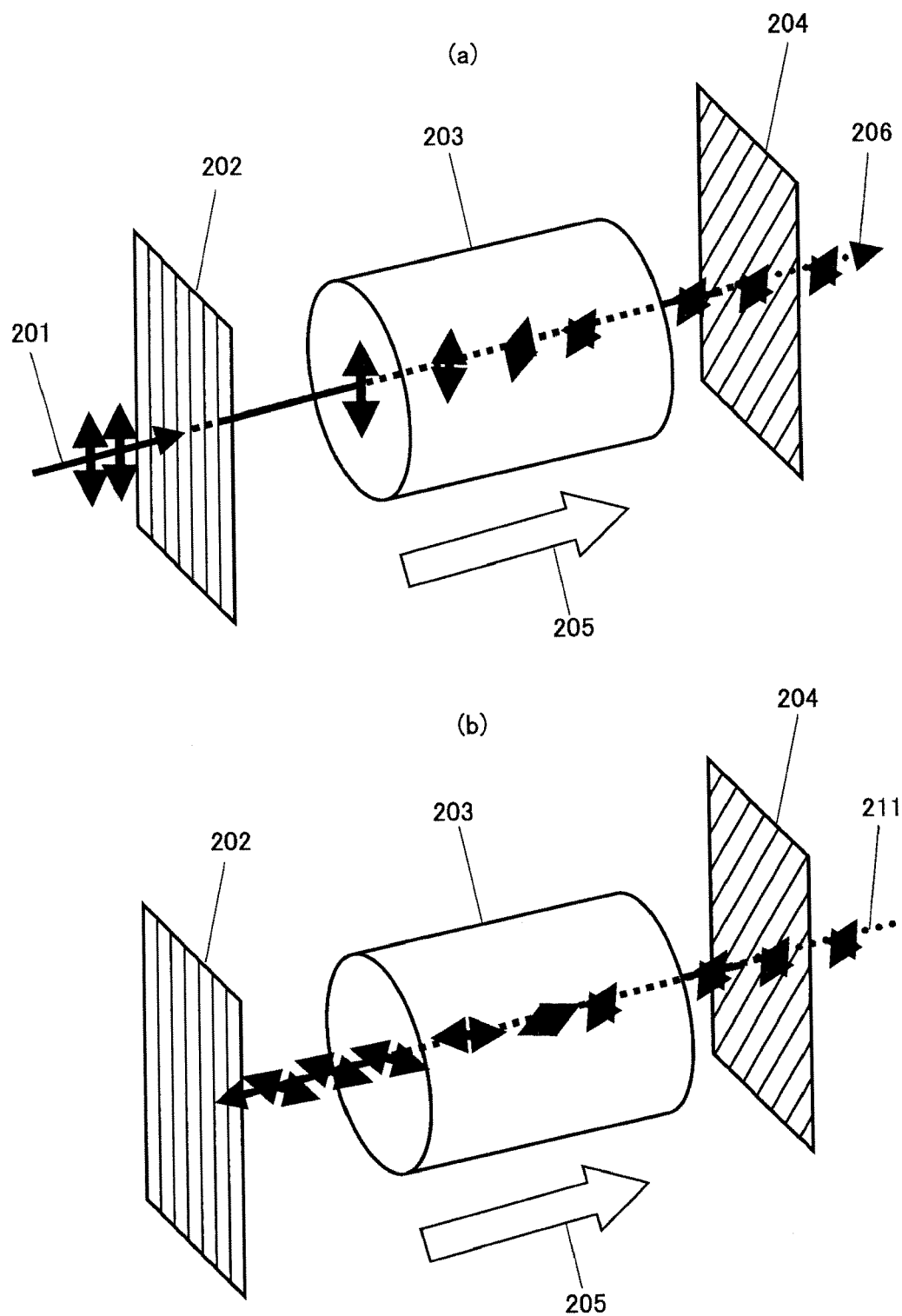
FIG. 2 is schematic illustrations showing the operation principle of the conventional optical isolator.
Figure 3:
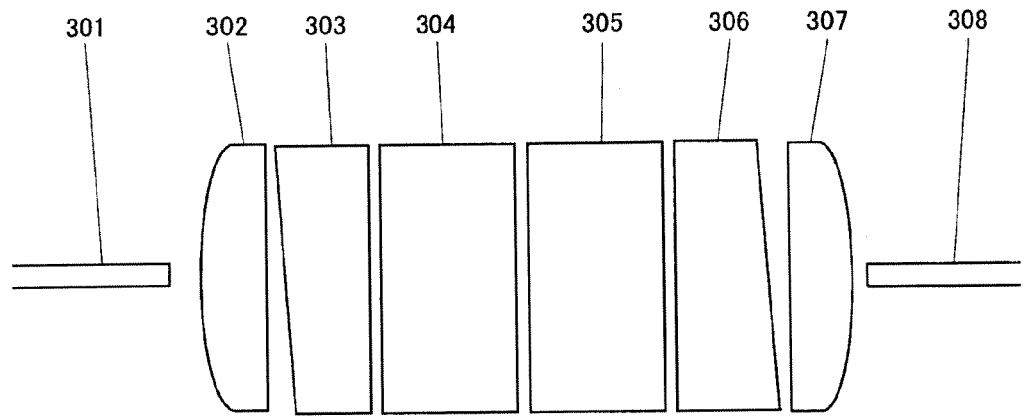
FIG. 3 is a schematic illustration showing a structure of the conventional optical amplifier.
Figure 4:
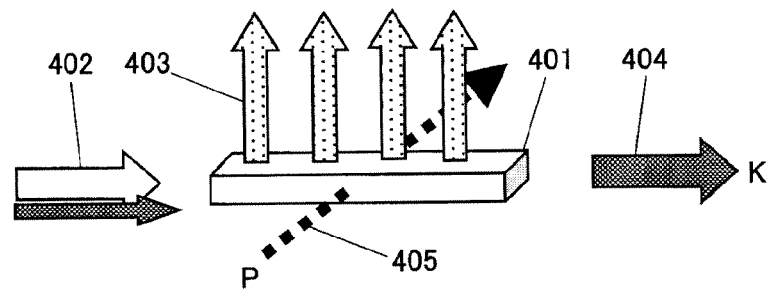
FIG. 4 is a schematic illustration showing a basic configuration of an optical fiber amplifier with a function of an optical isolator according to the present invention.

FIG. 4 is a schematic illustration showing a basic configuration of an optical fiber amplifier optical with a function of an optical isolator according to the present invention.

Figure 5:
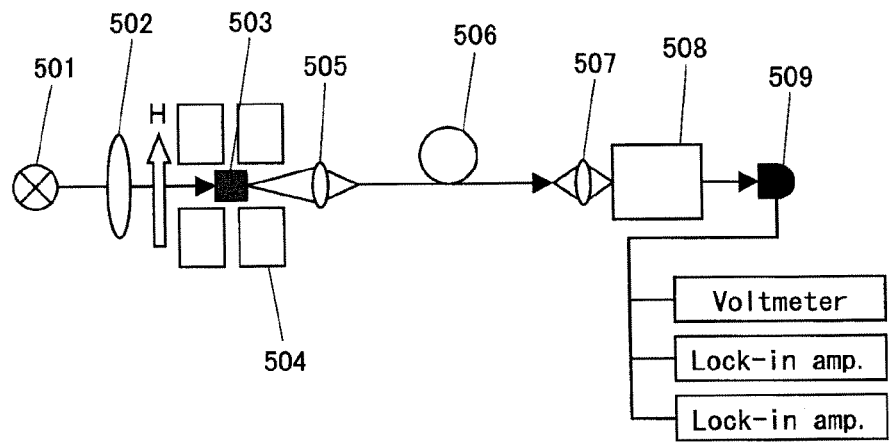
FIG. 5 is a schematic illustration showing an experimental apparatus to confirm the non-reciprocity of luminescence of an optical fiber amplifier with a function of an optical isolator according to the present invention.

In this figure, reference numeral 401 indicates a ferroelectric solid state material optical fiber amplifier, 402 indicates a laser light from a semiconductor laser for excitation, 403 indicates an external magnetic field, 404 indicates a light propagation direction K, 405 indicates a polarization P generated in advance in a ferroelectric solid state material of a ferroelectric solid state material optical fiber amplifier 401. FIG. 5 shows an experimental configuration to confirm the non-reciprocity of the luminescence from the optical fiber amplifier according to the present invention shown in FIG. 4.

In this figure, reference numeral 501 indicates a light source (a laser diode), 502, 505 and 507 indicate lenses, 503 indicates a sample, 504 indicates an apparatus for generating a magnetic field, 506 indicates an optical fiber, 508 indicates a spectrometer, and 509 indicates an optical detector.

A luminescence from the rare earth element Erbium (Er) in a Perovskite-type oxide $BaSrTiO_3$ as a material 503 exhibiting ferroelectricity at room temperature was dispersed by the spectrometer 508 and detected by the optical detector 509. The luminescence was generated by irradiating 980 nm semiconductor laser. The magnetic field was generated by an external coil as the apparatus for generating a magnetic field 504. The direction of the magnetic field and the direction of polarization P induced by an external electric field are aligned, respectively, perpendicular to the propagation direction K of the incident light.

Figure 6:
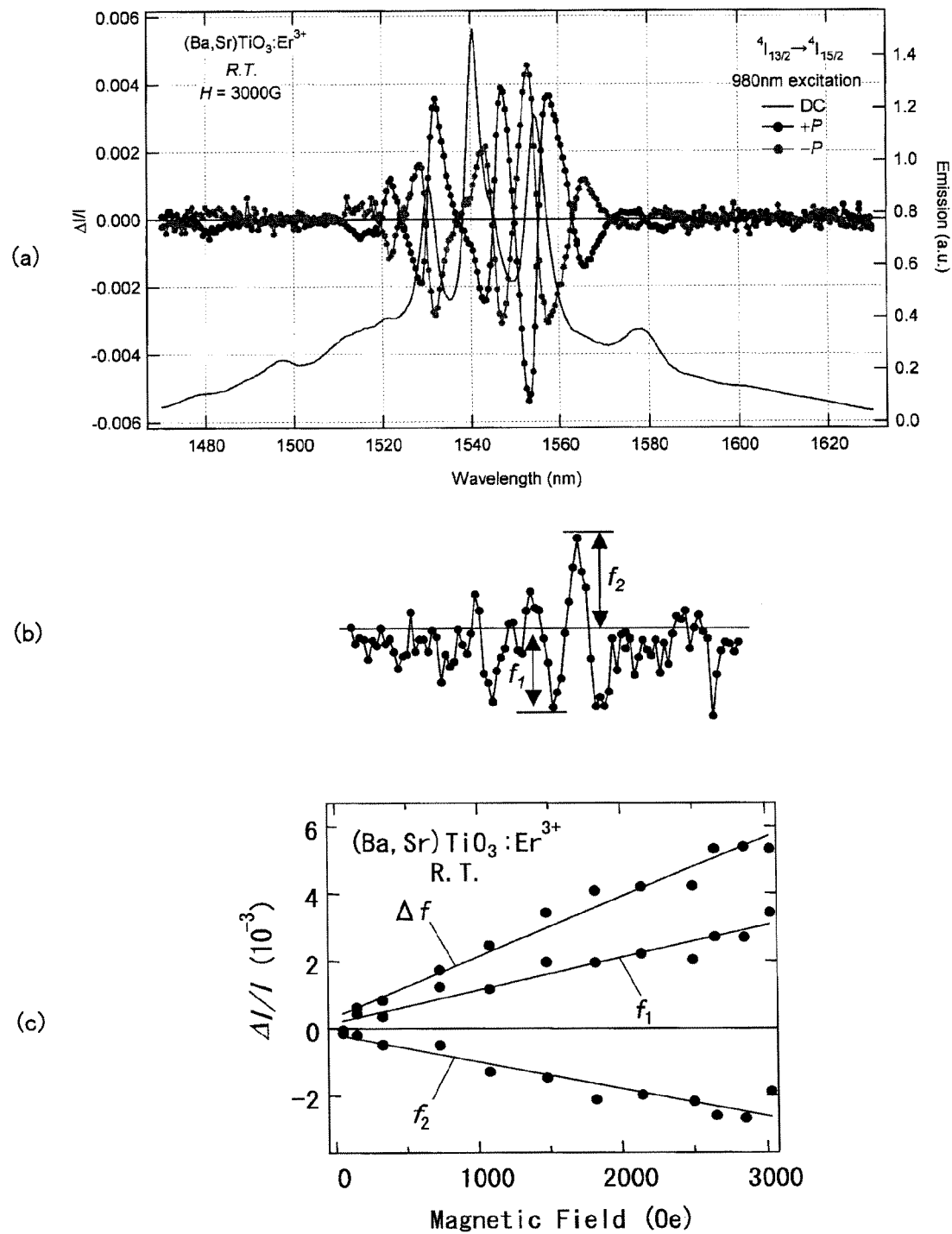
FIG. 6 is diagrams showing an experimental result performed using an experimental apparatus to confirm the non-reciprocity of luminescence, the result confirming the non-reciprocity of luminescence of an optical fiber amplifier with a function of an optical isolator according to the present invention.
Figure 7:
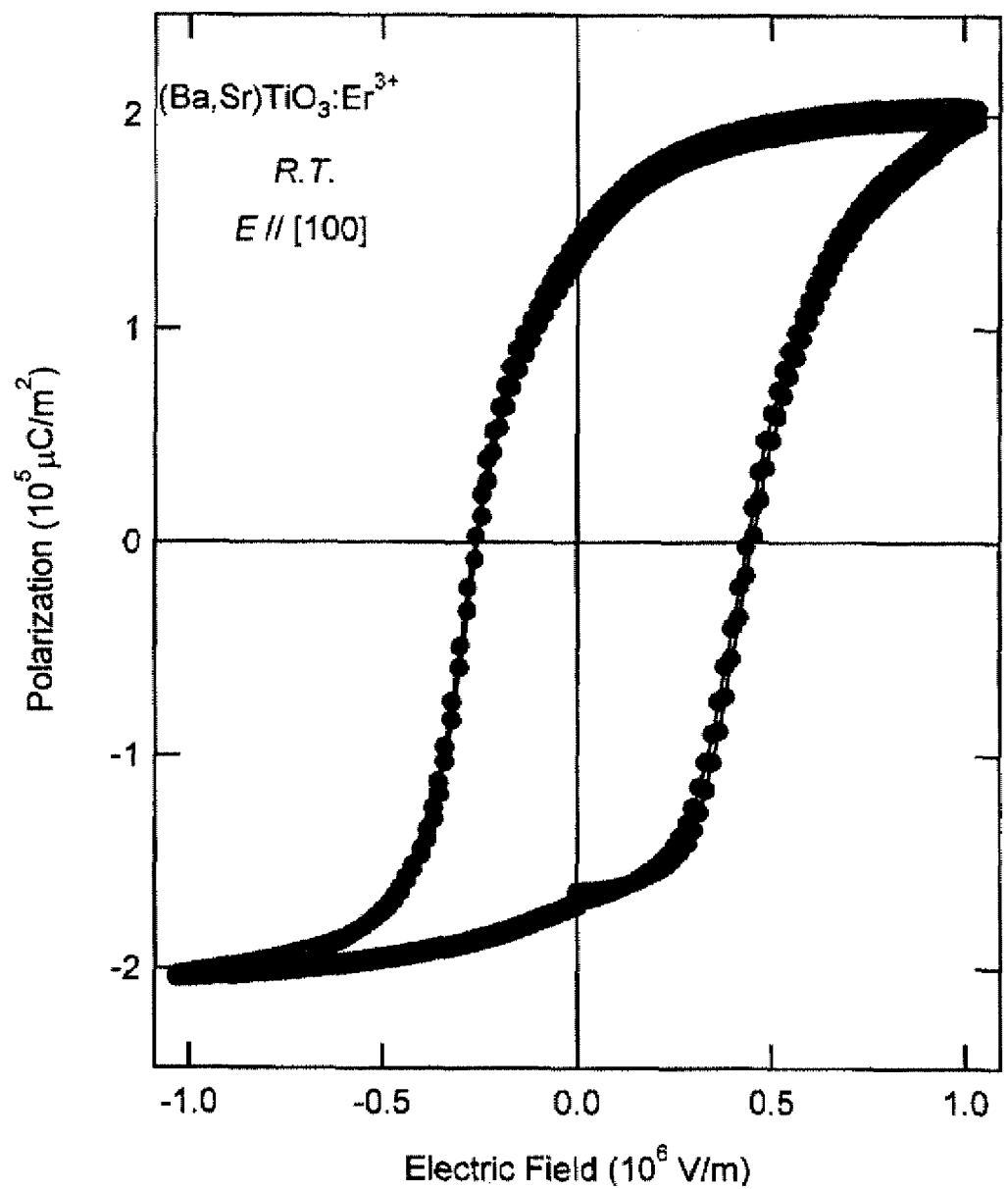
FIG. 7 is a diagram showing an electric field dependence of polarization in the ferroelectric material $BaSrTiO_3$ according to the present invention.

FIG. 6 shows an experimental result for luminescence from Er as shown in FIG. 5. FIG. 6(a) shows a luminescence spectrum due to a transition $^4I_{13/2}$ to $^4I_{15/2}$ of Er. FIG. 6(b) shows a part of the characteristics $1f$ (polarization −P). FIG. 6(c) shows the optical spectrum as a function of magnetic field intensity. FIG. 7 is a diagram showing an electric field dependence of polarization in the ferroelectric material $BaSrTiO_3$ according to the present invention.

In the figures, a luminescence band ranging from 1520 nm to 1600 nm can be observed. By fixing the magnetic field value at 3000 Oersted, an increasing part and a decreasing part of the luminescence spectrum intensity accompanied by reversing the polarization from (+P) to (−P) can be observed. As clearly be seen in FIG. 6(c), this modulation component increases its intensity in proportion to the intensity of the magnetic field.

As described above, a non-reciprocal optical effect is confirmed from the result that the sign of the increase and decrease in the modulation intensity is reversed according to the direction of the polarization, and that the modulation intensity depends linearly on the intensity of the magnetic field. In other words, the result indicates that the luminescence intensity depends on the light propagation direction K, and that the luminescence intensity increases in the direction K, and the luminescence propagating in the opposite (−K) direction decreases its intensity. The magnitude of the non-reciprocity effect in this case is an order of $\Delta I/I \approx 5.3 \times 10^{-3}$/mm at maximum. Therefore, an attenuation effect of magnitude $1/20$ can be expected in a case of 100 cm in length. When there is a length of this amount, it functions satisfactorily as an optical isolator. In addition, $BaTiO_3$ or Sr-doped version $BaSrTiO_3$ does not have any problem in using a semiconductor laser for optical amplification because the material is transparent at a wavelength region around 1 μm.

The present invention is characterized in that the optical isolator function can be provided to a rare earth element-doped optical fiber amplifier. As a result, an optical isolator which is an important constituent component of an optical amplifier can be omitted, and cost reduction in the optical amplifier can be realized.

According to the present invention, the optical fiber amplifier having the optical non-reciprocity function can be applied not only to optical amplification function, but also to optical modulation function, optical nonlinearity function, lasing function, optical switching function, optical detection function, and the like.

The present invention is not limited to the above-described embodiment, various modifications can be made without departing from the scope of the invention, and these modifications shall not be excluded from the scope of the invention.

According to the present invention, the following advantages can be obtained. By providing an optical fiber amplifier with the optical non-reciprocity function which is a function of an important constituent component for an optical amplifier, an optical isolator component need not be provided separately, and therefore cost reduction can be realized. In addition, a development of a transparent Faraday rotator for the optical isolator component becomes unnecessary.

INDUSTRIAL APPLICABILITY

The optical fiber amplifier according to the present invention is suitable for an optical amplifier which does not require an optical isolator.

The invention claimed is:

1. An optical fiber amplifier comprising a ferroelectric solid state material as a matrix material,
   wherein
   the ferroelectric solid state material is doped by a rare earth element,
   polarization is generated by applying an electric field at an angle close to perpendicular to the light propagation direction to the ferroelectric solid state material from which the optical fiber amplifier is constituted;
   the luminescence efficiency is different between the light propagation direction and the opposite direction thereto by applying a magnetic field in a direction close to perpendicular both the light propagation direction and the polarization direction, and
   the optical fiber amplifier has an optical amplification function and an optical non-reciprocity function.

2. The optical fiber amplifier according to claim 1, wherein the rare earth element is an Erbium (Er) element or a Thulium (Tm) element.

3. The optical fiber amplifier according to claim 2, wherein a rare earth element comprising Ytterbium (Yb) is furthermore doped as a rare earth element for photo-sensitization.

4. The optical fiber amplifier according to claim 1, wherein the ferroelectric solid state material is a Perovskite-type oxide which is a titanium oxide compound $AE_{1-x}AE'_xTiO_3$, wherein AE and AE' are an alkaline earth element selected from the group consisting of Ca, Sr, and Ba, and $0 \leq x \leq 1$.

5. The optical fiber amplifier according to claim 1, wherein the ferroelectric solid state material is a compound $Pb(Zr,Ti)O_3$.

6. The optical fiber amplifier according to claim 1, wherein the ferroelectric solid state material is a compound $(Pb,La)(Zr,Ti)O_3$.

7. A method for giving an optical non-reciprocity to the optical fiber amplifier according to any one of claims 1, 2 or 4, comprising:
   generating a polarization by applying an electric field at an angle close to perpendicular to the light propagation direction to the ferroelectric solid state material from which the optical fiber amplifier is constituted; and
   applying a magnetic field in a direction close to perpendicular both to the light propagation direction and to the polarization direction, wherein the luminescence efficiency is made different between the light propagation direction and the opposite direction thereto.

8. The optical fiber amplifier according to claim 1, wherein an optical isolator is omitted and a function of the optical isolator is provided by the rare-earth element-doped optical fiber amplifier.

9. The optical fiber amplifier according to claim 1, having a non-reciprocity effect equal or less of $\Delta I/I \approx 5.3 \times 10^{-3}$/mm.

* * * * *